United States Patent [19]
Kim et al.

[11] Patent Number: 5,313,056
[45] Date of Patent: May 17, 1994

[54] ELECTRONICALLY CONTROLLED FREQUENCY AGILE IMPULSE DEVICE

[75] Inventors: Anderson H. Kim, Toms River; Maurice Weiner, Ocean, both of N.J.; Louis J. Jasper, Jr., Fulton, Md.; Robert J. Youmans, Brick; Lawrence E. Kingsley, Shrewsbury, both of N.J.

[73] Assignee: The United States of America as represented by the Secretary of the Army, Washington, D.C.

[21] Appl. No.: 103,494

[22] Filed: Aug. 6, 1993

[51] Int. Cl.⁵ .............................. H01J 40/14
[52] U.S. Cl. .................. 250/208.4; 257/432; 385/1
[58] Field of Search ............. 257/432; 385/1; 250/208.4

[56] References Cited

U.S. PATENT DOCUMENTS 5,028,971 7/1991 Kim et al.
5,227,621 7/1993 Kim et al. .................. 250/214.1

OTHER PUBLICATIONS

"Ultra-Wideband High Power Photon Triggered Frequency Independent Radiator," Ser. No. 07/946,718, filed by Kim et al, Sep. 18, 1992.
"Pulse Sharpening Using An Optical Pulse," Ser. No. 08/061,612, filed by Kim et al. May 6, 1993.

*Primary Examiner*—Nelson Moskowitz
*Attorney, Agent, or Firm*—Michael Zelenka; James A. DiGiorgio

[57] ABSTRACT

An electronically controlled frequency agile impulse source utilizing pulse sharpening techniques to increase its versatility in radiating impulse energy at a variety of center frequencies and bandwidths in the megahertz to the gigahertz range. Such pulse sharpening provides for a radiator having a wider range of applications.

1 Claim, 1 Drawing Sheet

ELECTRONICALLY CONTROLLED FREQUENCY AGILE IMPULSE DEVICE

GOVERNMENT INTEREST

The invention described herein may be manufactured, used, and licensed by or for the Government of the United States of America for governmental services without the payment to us of any royalty thereon.

FIELD OF THE INVENTION

This invention relates generally to pulse power technology and, more particularly, to optical pulse-sharpening of subnanosecond, high peak pulse generators used in devices such as impulse radars, air traffic control, counterstealth, medical imaging systems, signal jammers, and high power microwave (HPM) weapon systems.

BACKGROUND OF THE INVENTION

In recent years there has been active research in the area of nanosecond-type pulse generation. Such research has produced GaAs substrate high power storage devices that utilize photoconductive solid state switching to generate nanosecond-type pulses. One such switch, disclosed in U.S. Pat. No. 5,028,971, issued to Anderson H. Kim et al on Jul. 2, 1991, entitled, "High Power Photoconductor Bulk GaAs Switch" is incorporated herein by reference.

The "Bulk GaAs Switch" is basically an electrical energy storage device comprised of two mutually opposite gridded electrodes positioned on opposite surfaces of a GaAs semiconductor substrate such that a power supply means can provide an electric field in a predetermined direction across the patterned electrodes. The device is photoconductively activated to discharge its stored energy when it receives light radiation at a predetermined wavelength. When light energy penetrates the substrate region it generates electron/hole pairs which cause the electrical resistance of the semiconductor material to decrease. As a result, the stored electrical energy will instantaneously discharge through a load.

It is widely recognized that when such devices discharge properly, they radiate pulses in a direction perpendicular to the substrate surface. The bandwidth of such pulses is determined and/or limited by the speed with which the device discharges and recovers. In general there is a direct correlation between the output pulsewidth and the center frequency of the radiated waveform. As the pulsewidth narrows, the bandwidth increases and the center frequency shifts towards the higher frequency spectrum. For the wider pulsewidth, the center frequency of the radiated waveform becomes lower. Consequently, those skilled in the art recognize that by controlling the output pulse characteristics, one can control the center frequency and bandwidth of the radiated energy, and thus increase the effectiveness as well as the versatility of the systems utilizing such impulse generators.

The critical elements in controlling the radiated pulsewidth of such GaAs energy storage devices are its construction (shape, size, etc.) and the switching technique (photoconductive triggering of the stored energy discharge). Heretofore, two general techniques have been used to generate such narrow pulsewidth (ultrawideband) radiation.

The first technique utilizes the recombination property of the semiconductor material from which the switch itself is fabricated. This technique (using photoconductive GaAs switches), however, typically generates a signal with a long pulsewidth due to a relatively long recovery time. The long recovery time is attributed to the inherent properties of gallium arsenide, including: (1) the substantially long recombination time and (2) the switch lock-on phenomena. As such, this technique is not desirable for generating narrow pulses and thus for having ultrawideband radiation.

The second technique utilizes an energy storage element which is comprised of either a short section of transmission line or a capacitor. The energy storage element is photoconductively triggered to instantaneously discharge all or substantially most of its stored energy to an impedance load. As with the aforementioned technique, the extended recovery time inherent in photoconductive switches prevents this device from producing extended wideband radiation.

A major breakthrough in this pulsewidth problem, however, was presented in the inventors copending patent application entitled "Ultra-Wideband High Power Photon Triggered Frequency Independent Radiator," Ser. No. 07/946,718, filed by Kim et al, Sep. 18, 1992 now U.S. Pat. No. 5,227,621 and incorporated herein by reference. This frequency radiator combines an energy storage function and an antenna radiating function into one structure to create an ultra wideband frequency radiator capable of generating pulses with a range of frequency components from hundreds of megahertz to several gigahertz. Basically, this radiator utilizes two identical quasi-radial transmission line structures to store electric energy while it implements photoconductive switching to trigger the instantaneous discharge of the stored energy to generate the desired ultra wideband RF radiation.

Such an energy storage device comprises a dielectric storage medium, two quasi-radially shaped, metalized electrodes mounted opposite one another on the top surface of the dielectric storage medium and a metalized electrode mounted on the bottom surface of the dielectric medium. A photoconductive switch, centrally located on the dielectric between the two quasi-radially shaped electrodes, connects the two quasi-radially shaped electrodes to the bottom electrodes through a load impedance. When the switch is activated by light radiation, the stored energy discharges through the load impedance generating a sub-nanosecond-type pulse.

Although such a device provides for fast rise-time pulses, the radiation bandwidth is limited by the trigger speed of the photoconductive switch and the recovery time of the GaAs substrate. One method of breaking through these physical limits and thus increasing the radiation bandwidth is by sharpening the discharge pulse (a sharpened pulse has a fast rise-time as well as fast falltime).

A method of sharpening the radiated pulsewidth has been disclosed in copending patent application, Ser. No. 08/061,612, entitled "Pulse Sharpening Using An Optical Pulse," filed May 6, 1993. The method consists of coupling an optical pulse from a laser system into two separate fibers of different length (Fiber1=L and Fiber2=L+δL) to create a delay between the signals. Specifically, the optical pulse conveyed through fiber1 triggers the discharge of the device, and the optical pulse conveyed through fiber2 illuminates the gap between the transmission line and the load (to turn off the device). Hence, the energy extraction from the device is abruptly terminated, and the radiating pulse incurs a fast falltime, thus sharpening the pulse.

This pulse sharpening technique, however, is not versatile in that it does not provide the capability for one device to effectively generate a multiple of output pulsewidths having center frequencies ranging from hundreds of megahertz to several gigahertz (which would be useful for many different applications as described above). Consequently, those skilled in the art recognize both the need and the benefit of a device capable of radiating a range of pulsewidths from a single optical pulse source.

SUMMARY OF THE INVENTION

Accordingly, the general purpose of this invention is to utilize a pulse sharpening technique to provide a radiator that generates ultra wideband RF radiation at an adjustable range of center frequencies and bandwidths. This object is achieved by utilizing an optical means to trigger the energy discharge of a semi-insulating GaAs energy storage substrate and to abruptly terminate that discharge at an adjustable (predetermined) interval of time. The chosen time interval directly determines the center frequency of the radiated pulse. The net result is a frequency agile device capable of a wider range of applications.

In a preferred embodiment, the invention is comprised of a monolithic, photoconductive impulse generating device having metalized electrodes on two opposing surfaces (a front side and a back side). On the back side of the monolithic device there are concentric electrodes including and an inner most concentric circle positioned such that a gap between the inner most concentric electrode and the inner concentric circle forms a coaxial output terminal. When a radial transmission line is connected to the coaxial output terminal, a cylinder shaped capacitor for extracting the energy stored in the monolithic device is formed.

A laser light source is optically connected to each surface through a fiber optic cable wherein the cable leading to the top surface is of a predetermined fixed length and the cable leading to the bottom surface is adjustable such that its length can varied within some predetermined range. This forces the bottom surface pulse to travel longer optical paths than the top surface pulse so that variable optical delays between the pulse trains are achieved.

The bottom surface pulse delay is electronically controlled by a rotating mirror. Light from the laser source is split into two beams such that one beam is coupled to the top surface fiber of fixed length and the other beam is directed to the rotatable mirror which directs the beam to a predetermined fiber cable in a fiber bundle which lead to the bottom surface of the substrate. Each fiber in the fiber bundle is a different length than the other, but all are greater in length than the top surface fiber cable. Consequently, as the mirror rotates to different positions, the bottom surface pulse will be delayed by different times depending on the length of the fiber cable chosen.

DETAILED DESCRIPTION OF THE INVENTION

Figure 1:
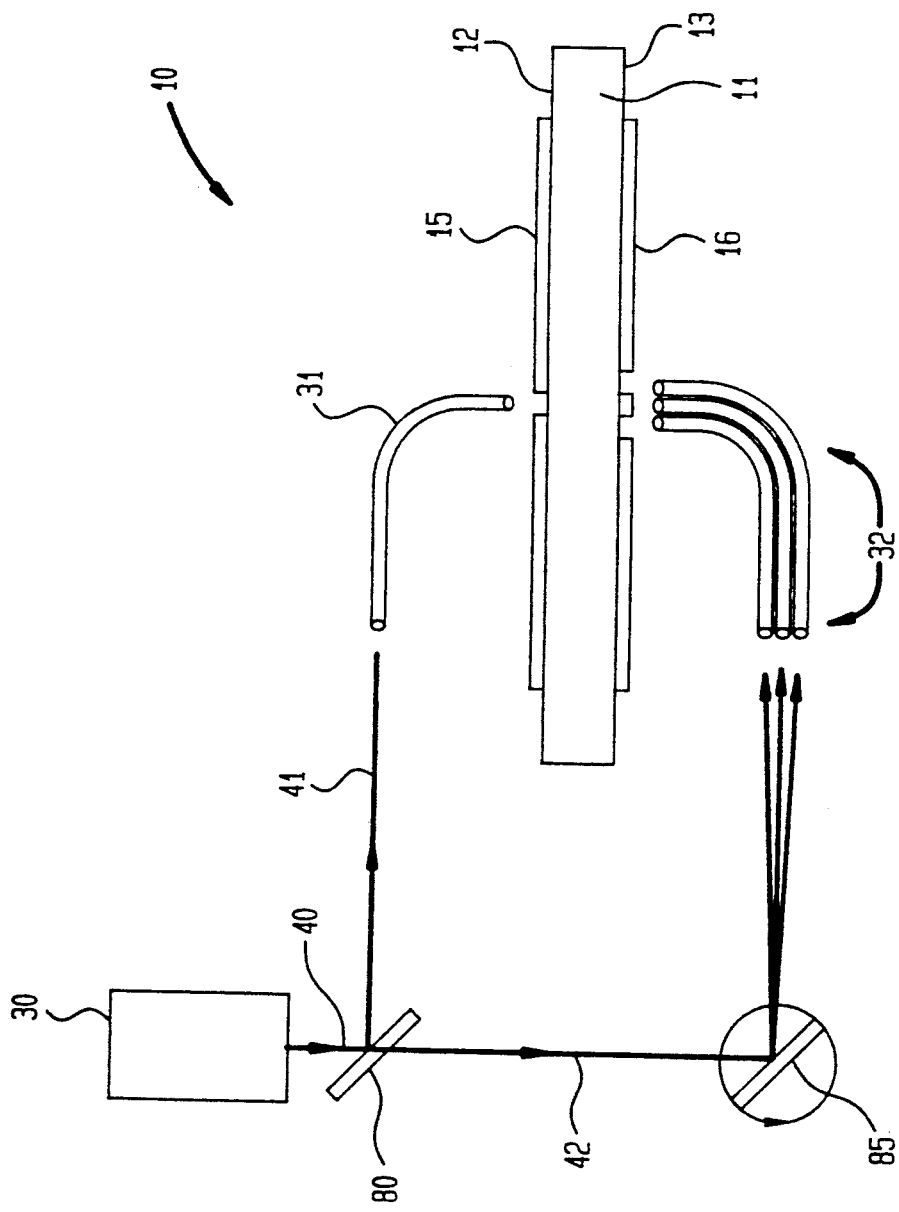
FIG. 1 is a pictorial view of the preferred embodiment showing an optical means for agile pulse sharpening using a laser source, a rotatable mirror, and fiber optic cables having different predetermined lengths.

Referring now to the drawing there is shown in FIG. 1 a monolithic, photoconductive impulse generator 10 optically coupled to laser 30 through fiber optic cables 31 and fiber bundle 32.

Device 10 is comprised of photoconductive semiconductor substrate 11 which has a top and bottom surface 12 and 13, respectively. Top surface 12 has metalized electrode 15 resting on its surface whereas bottom surface 13 has metalized electrode 16 resting on its surface. Electrodes 15 and 16 are positioned such that they can be electrically charged by a power supply means (not shown) to provide impulse generator 10's energy storage capability.

Laser 30 directs light beam 40 into beam splitter 80 which splits beam 40 into beams 41 and 42. Beam 41 is directed into fiber cable 31 which conveys beam 41 to top surface 12 to trigger the energy discharge of device 10. Beam 42, however, is directed at rotatable mirror 85 which can be electronically controlled to direct beam 42 to a predetermined fiber in fiber bundle 32. Each fiber cable in fiber bundle 32 has a predetermined length that is different from all other cables in bundle 32, but greater than that of cable 31. Consequently, beam 42 will travel a greater optical distance than beam 41 and essentially create a delay between the time beam 41 hits top surface 12 (to start discharge) and the time beam 42 hit surface 13 (to stop the discharge).

As discussed above, by abruptly stopping the energy discharge, the radiated pulse will be sharpened and the center frequency of propagation will be increased. This allows the electronic rotatable mirror to provide electronic control over the sharpening of the radiated pulse by some predetermined amount so that device 10 can be electronically controlled to radiate energy at a range of center frequencies.

What is claimed is:
1. An electronically controlled, frequency agile impulse radiator, comprising;
   a semiconductor substrate having at least two opposing surfaces each having a metalized electrode positioned such that electrostatic energy can be stored thereon;
   a power supply means for applying an electric field in a predetermined direction across said electrodes such that said power is stored on said metalized electrodes; and
   an optic means for triggering the discharge of said stored energy and abruptly terminating said discharge after a predetermined interval of time, said optic means comprising a laser light source, a beam splitter, and an electronically controlled rotatable mirror, said laser source directing light into said beam splitter such that a first beam is directed into a first fiber optic cable coupled to said top surface electrode, and a second beam is directed to said rotatable mirror electronically positioned such that it directs said second beam into a second fiber optic cable coupled to said bottom surface of said substrate, said second fiber being part of a fiber bundle having a predetermined amount of fibers therein, each fiber in said fiber bundle having different lengths by some predetermined amount greater than said first fiber.

* * * * *